United States Patent
Klomsdorf et al.

(10) Patent No.: US 7,151,947 B2
(45) Date of Patent: Dec. 19, 2006

(54) METHOD AND APPARATUS FOR CONTROLLING TRANSMISSION POWER ASSOCIATED WITH A TRANSMITTING UNIT

(75) Inventors: Armin Klomsdorf, Libertyville, IL (US); Francis Forest, Lake Villa, IL (US)

(73) Assignee: Motorola, Inc., Schaumburg, IL (US)

( * ) Notice: Subject to any disclaimer, the term of this patent is extended or adjusted under 35 U.S.C. 154(b) by 408 days.

(21) Appl. No.: 10/141,331

(22) Filed: May 8, 2002

(65) Prior Publication Data

US 2004/0203983 A1    Oct. 14, 2004

(51) Int. Cl.
*H04B 7/00*    (2006.01)
(52) U.S. Cl. ...................... 455/522; 455/69; 455/127.1
(58) Field of Classification Search ............. 455/127.1, 455/127.5, 522, 69, 574, 13.4
See application file for complete search history.

(56) References Cited

U.S. PATENT DOCUMENTS

| 5,590,411 | A | 12/1996 | Sroka et al. | |
|---|---|---|---|---|
| 5,862,460 | A | 1/1999 | Rich | |
| 6,587,511 | B1* | 7/2003 | Barak et al. | 375/295 |
| 6,615,051 | B1* | 9/2003 | Saarela | 455/522 |

FOREIGN PATENT DOCUMENTS

| GB | 2344007 A | 5/2000 |
|---|---|---|
| GB | 2 349 522 A | 11/2000 |
| WO | WO 99/30426 | 6/1999 |

\* cited by examiner

*Primary Examiner*—Quochien B. Vuong
*Assistant Examiner*—Michael Chu
(74) *Attorney, Agent, or Firm*—Randall S. Vaas

(57) ABSTRACT

A method (800) and an apparatus for controlling transmission power associated with a transmitting unit (220) are described herein. The transmitting unit (220) generally includes a processing component (310), a baseband controller (320), a linearization controller (330), a variable baseband source (340), and a radio frequency (RF) component (350). The variable baseband source (340) may generate a baseband signal based on an input signal. The RF component (350) may generate an RF signal based on the baseband signal. The processing component (310) may generate a first control signal and a second control signal. Further, the processing component (310) may provide the first control signal to the baseband controller (320) to adjust the variable baseband source (340), and provide the second control signal to the linearization controller (330) to adjust the RF frequency component (350).

16 Claims, 7 Drawing Sheets

METHOD AND APPARATUS FOR CONTROLLING TRANSMISSION POWER ASSOCIATED WITH A TRANSMITTING UNIT

TECHNICAL FIELD

The present disclosure relates to wireless communication systems, and more particularly, to a method and an apparatus for controlling transmission power associated with a transmitting unit.

BACKGROUND

A wireless communication system is a complex network of systems and elements. Typical systems and elements include (1) a radio link to mobile stations (e.g., a cellular telephone or a subscriber equipment used to access the wireless communication system), which is usually provided by at least one and typically several base stations, (2) communication links between the base stations, (3) a controller, typically one or more base station controllers or centralized base station controllers (BSC/CBSC), to control communication between and to manage the operation and interaction of the base stations, (4) a switching system, typically including a mobile switching center (MSC), to perform call processing within the system, and (5) a link to the land line, i.e., the public switch telephone network (PSTN) or the integrated services digital network (ISDN).

A base station subsystem (BSS) or a radio access network (RAN), which typically includes one or more base station controllers and a plurality of base stations, provides all of the radio-related functions. The base station controller provides all the control functions and physical links between the switching system and the base stations. The base station controller is also a high-capacity switch that provides functions such as handover, cell configuration, and control of radio frequency (RF) power in the base stations.

The base station handles the radio interface to the mobile station. The base station includes the radio equipment (transceivers, antennas, amplifiers, etc.) needed to service each communication cell in the system. A group of base stations is controlled by a base station controller. Thus, the base station controller operates in conjunction with the base station as part of the base station subsystem to provide the mobile station with real-time voice, data, and multimedia services (e.g., a call).

To ensure that all mobile stations receive proper communication services, the base station typically provides power control information. To illustrate this concept, mobile stations serviced by the base station may be anywhere in the communication cell from right under the antenna of the base station to a couple of miles away from the base station. If all of the mobile stations used the same amount of transmission power (i.e., radio frequency (RF) output power), a mobile station proximate to the base station may cause interference to a mobile station distant from the base station. To mitigate this problem, the base station provides each of the mobile stations with power control information so that the mobile stations may optimally control their transmission power and all signals arrive at the base station at substantially equal power. For example, the base station may instruct a mobile station to operate at a reduced transmission power to avoid causing interference to other mobile stations. In particular, the mobile station may vary its transmission power from a few tens of nanowatts up to the order of one watt (W). To reduce transmission power, the gain of the mobile station may be attenuated by adjusting the bias level of the mobile station (e.g., reducing control voltage of the mobile station). Accordingly, the mobile station demands less supply current which, in turn, reduces the third-order intercept point (IP3) level of the mobile station. In particular, the IP3 level indicates the linearity of an RF signal (i.e., distortion level of the signal) from the mobile station. Therefore, higher IP3 level may result in a more distortion-free RF signal from the mobile station but may also require more supply current (i.e., result in greater power consumption by the mobile station).

Typically, the supply current of a mobile station is constant (i.e., the input power is constant). However, the third-order intercept point (IP3) level may decrease as the transmission power is reduced. Thus, unless the input power of the mobile station is appropriately reduced as well, inter-modulation distortion may be generated during reduction of transmission power because of an insufficient IP3 level for a given amount of input power. In particular, inter-modulation distortion may cause RF energy to overflow into adjacent and/or alternate channels of a frequency band. That is, the RF energy may exceed the acceptable level specified by a wireless communication protocol that is allowed in the frequency band. As a result, spurious RF emissions and degradation in signal quality may occur during reduction of transmission power.

Further, the trend in the wireless communication industry is not only to provide small hand-held portable devices but also to provide additional user features and functionality. Thus, one aspect of designing a wireless communication system is to optimize the resources available to the mobile station. That is, one method of improving the availability of resources is to reduce the amount of power consumed by a transmitting unit of the mobile station. By reducing power consumption of a mobile station, transmission time may be extended and/or smaller capacity and size batteries may be used.

Therefore, a need exist to control transmission power associated with a transmitting unit of a mobile station to improve transmission efficiency during power reduction and to optimize communication resources of a wireless communication system.

BRIEF DESCRIPTION OF THE DRAWINGS

This disclosure will describe several embodiments to illustrate its broad teachings. Reference is also made to the attached drawings.

DETAILED DESCRIPTION

Figure 1:
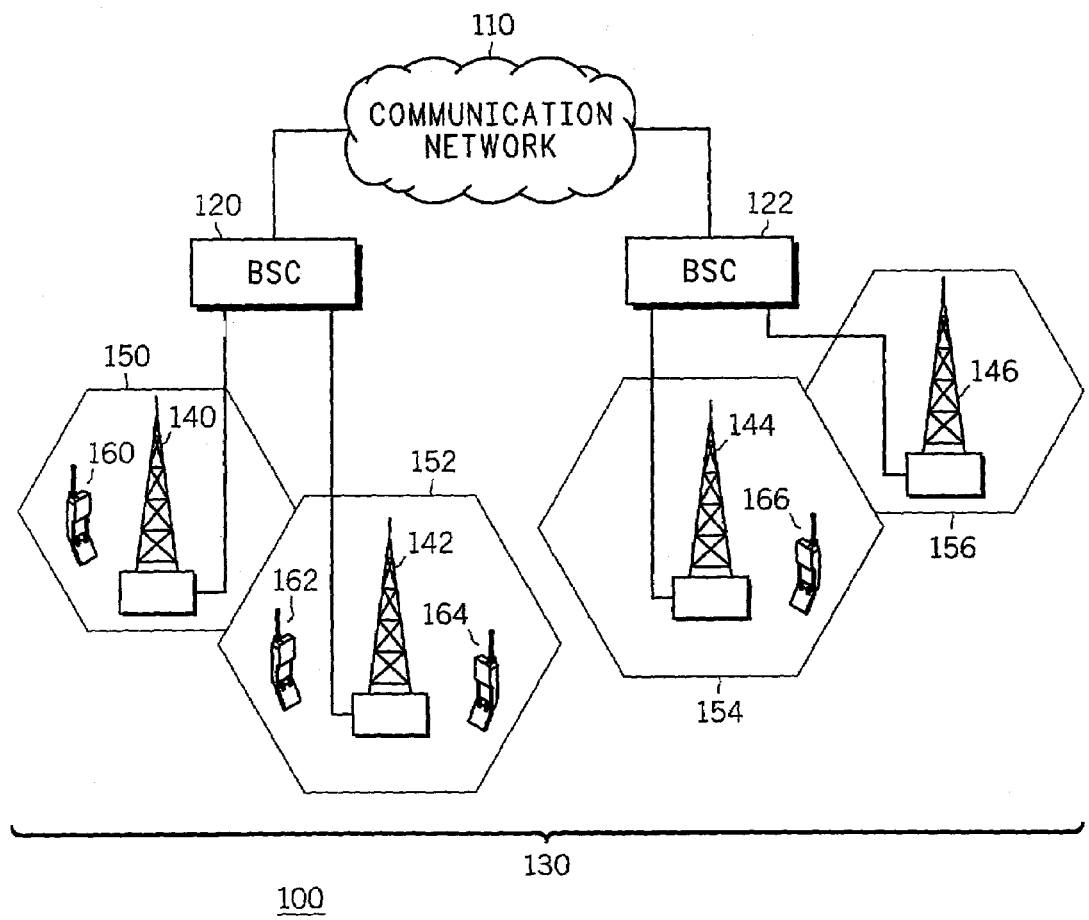
FIG. 1 is a block diagram representation of a wireless communication system that may be adapted to operate in a manner as described herein.

A method and an apparatus for controlling transmission power associated with a transmitting unit are described. In a wireless communication system, a base station provides power control information to a mobile station for transmission of a radio frequency (RF) signal. The mobile station generally includes a transmitting unit operable to generate the radio frequency signal based on an input signal and a baseband signal. The transmitting unit may be operable in accordance with a variety of wireless communication protocols such as, but not limited to, a code division multiple access (CDMA) based communication protocol, a time division multiple access (TDMA) based communication protocol, a global service for mobile communications (GSM) based communication protocol, a Bluetooth based communication protocol, and a wireless local area network (WLAN) communication protocol (e.g., an Institute of Electrical and Electronics Engineer (IEEE) 802.11 based communication protocol). In particular, the transmitting unit may include, but is not limited to, a variable baseband source, a radio frequency (RF) component, a power amplifier, a processing component, a baseband controller, and a linearization controller.

The variable baseband source is operatively coupled to the processing component and the baseband controller. The variable baseband source is operable to generate a baseband signal based on an input signal from the processing component. In particular, the variable baseband source may include, but is not limited to, a digital multiplier operatively coupled to the processing component, a digital-to-analog converter operatively coupled to the digital multiplier, an attenuator (e.g., a programmable baseband step attenuator) operatively coupled to the digital-to-analog converter and the baseband controller, and a baseband filter operatively coupled to the attenuator and the RF component. The variable baseband source may also include a channel filter (e.g., a finite impulse response (FIR) filter) operatively coupled to the processing component and the digital multiplier.

Operatively coupled to the variable baseband source is the RF component. In particular, the RF component is operable to generate the RF signal based on the output of the variable baseband source, i.e., the baseband signal. The RF component may include, but is not limited to, an RF mixer operatively coupled to the variable baseband source, a variable gain amplifier component operatively coupled to the RF mixer and the linearization controller, and an interstage filter operatively coupled to the variable gain amplifier component and the power amplifier. For example, the variable gain amplifier component may include a post-mixer amplifier, a first voltage controlled amplifier (VCA), and a second voltage controlled amplifier (VCA), which are operatively coupled to the linearization controller. In an alternate embodiment, the second VCA may be operatively coupled to the processing component.

To control transmission power associated with the transmitting unit (i.e., RF output power), the processing component is operatively coupled to the variable baseband source and the RF component. That is, the processing component may synchronously adjust the baseband and RF controls of the transmitting unit to change the RF output power. During an RF output power reduction (i.e., back-off), for example, the processing component may reduce the input power and the bias level (e.g., current or voltage) associated with the transmitting unit. To illustrate this concept, the processing component may generate a first control signal and a second control signal based on power control information from the base station. In particular, the processing component may provide the first control signal to the baseband controller which, in turn, may adjust the variable baseband source based on the first control signal. For example, the baseband controller may reduce power associated with the input signal to generate the baseband signal (i.e., input power). Likewise, the processing component may provide the second control signal to the linearization controller which, in turn, may adjust the radio frequency (RF) component based on the second control signal. Based on the second control signal, the linearization controller may reduce power associated with the baseband signal to generate the radio frequency (RF) signal. That is, the second control signal may be used to adjust the bias level of the RF component to adjust the gain/attenuation of the RF signal. Accordingly, reductions in power associated with the input signal and the baseband signal may reduce the amount of supply current demanded by the mobile station. As a result, transmission time of a battery powering mobile station (i.e., battery life) may be extended because the amount of supply current may be reduced as the RF output power is backed off.

A communication system is also described, and particularly, in terms of a wireless communication system operating in accordance with at least one of several standards. These standards include analog, digital or dual-mode communication system protocols such as, but not limited to, the Advanced Mobile Phone System (AMPS), the Narrowband Advanced Mobile Phone System (NAMPS), the Global System for Mobile Communications (GSM), the IS-55 Time Division Multiple Access (TDMA) digital cellular, the IS-95 Code Division Multiple Access (CDMA) digital cellular, CDMA 2000, the Personal Communications System (PCS), 3G, the Universal Mobile Telecommunications System (UMTS) and variations and evolutions of these protocols. As shown in FIG. 1, a wireless communication system 100 includes a communication network 110, and a plurality of base station controllers (BSC), generally shown as 120 and 122, servicing a total service area 130. The wireless communication system 100 may be, but is not limited to, a frequency division multiple access (FDMA) based communication system, a time division multiple access (TDMA) based communication system, and code division multiple access (CDMA) based communication system. As is known for such systems, each BSC 120 and 122 has associated therewith a plurality of base stations (BS), generally shown as 140, 142, 144, and 146, servicing communication cells, generally shown as 150, 152, 154, and 156, within the total service area 130. The BSCs 120 and 122, and base stations 140, 142, 144, and 146 are specified and operate in accordance with the applicable standard or standards for providing wireless communication services to mobile stations (MS), generally shown as 160, 162, 164, and 166, operating in communication cells 150, 152, 154, and 156, and each of these elements are commercially available from Motorola, Inc. of Schaumburg, Ill.

To ensure proper communication services are provided to mobile stations within a communication cell, a base station may provide the mobile stations with power control information. The power control information may specify the transmission power to be generated by a transmitting unit of a mobile station (i.e., RF output power). For example, the base station 142 may provide the mobile station 162 with power control information so that the mobile station 162 may transmit to the base station 142 without causing interference to other mobile stations serviced by the base station 142 such as mobile station 164. Based on the power control information, the mobile station 162 may be operable to control its transmission power and improve on its transmission efficiency.

Figure 2:
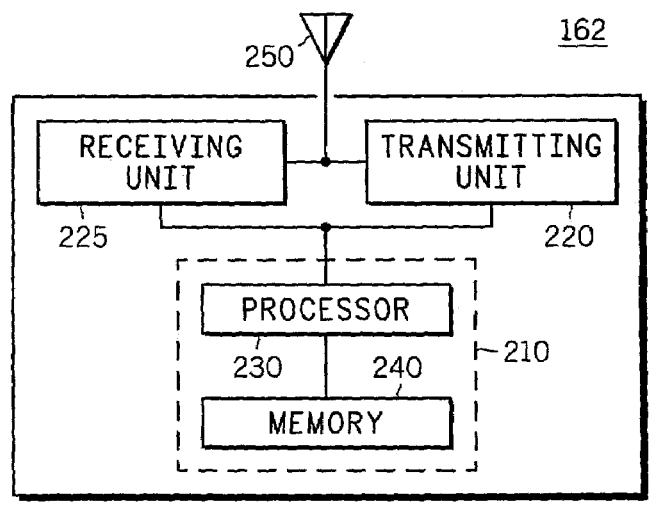
FIG. 2 is a block diagram representation of a mobile station.

As shown in FIG. 2, the mobile station 162 may be adapted in accordance with a preferred embodiment of the invention to control transmission power associated with a transmitting unit. The mobile station 162 generally includes a controller 210, a transmitting unit 220 and a receiving unit 225. The controller 210 generally includes a processor 230 and a memory 240. The processor 230 is operatively coupled to the memory 240, which stores a program or a set of operating instructions for the processor 230. Accordingly, the processor 230 executes the program or the set of operating instructions such that the mobile station 162 operates in accordance with a preferred embodiment of the invention. The program or set of operating instructions may be embodied in a computer-readable medium such as, but not limited to, paper, a programmable gate array, an application specific integrated circuit (ASIC), an erasable programmable read only memory (EPROM), a read only memory (ROM), a random access memory (RAM), a magnetic media, and an optical media.

Figure 3:
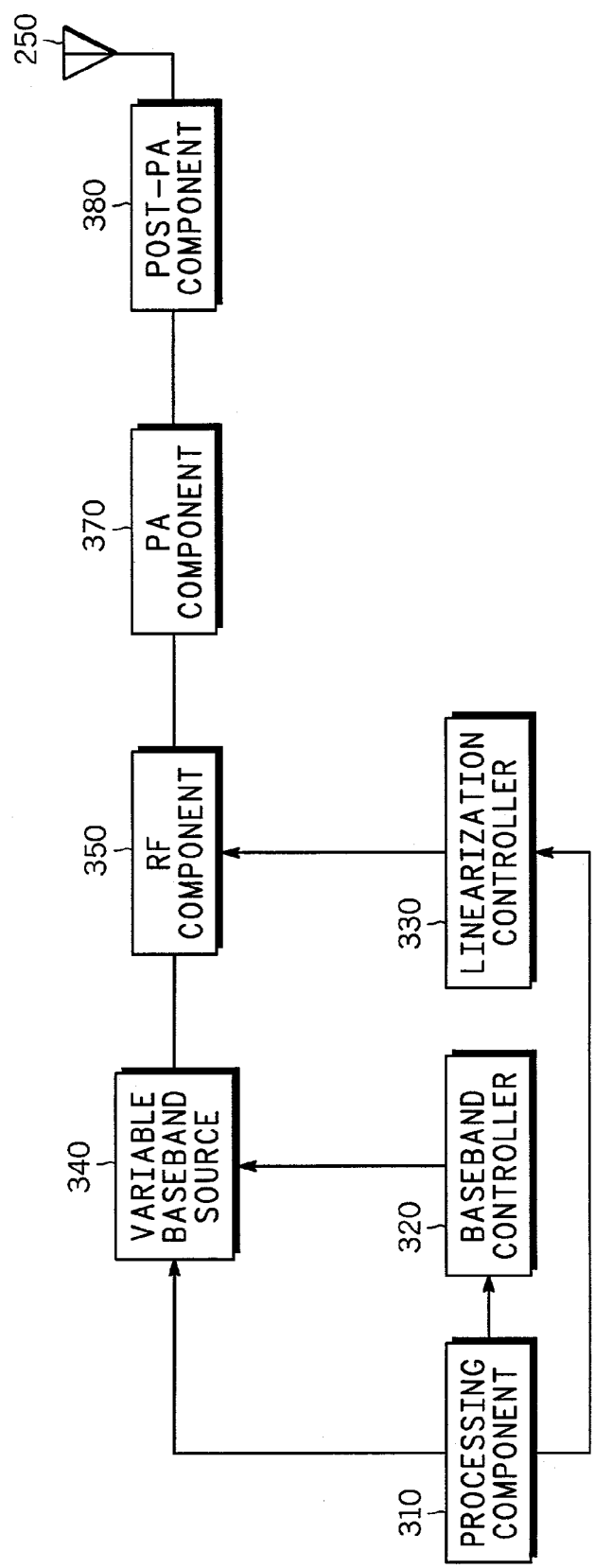
FIG. 3 is a block diagram representation of a transmitting unit.

The receiving unit 225 is operatively coupled to the controller 210 and an antenna 250. The transmitting unit 220 is also operatively coupled to the controller 210 and the antenna 250. Referring to FIG. 3, the transmitting unit 220 generally includes a processing component 310, a baseband controller 320, a linearization controller 330, a variable baseband source 340, and a radio frequency (RF) component 350. The processing component 310 is operatively coupled to the baseband controller 320, the linearization controller 330, and the variable baseband source 340. The processing component 310 may be, but is not limited to, a microprocessor control unit (MCU) for digital signal processing (DSP). The baseband controller 320 is operatively coupled to the variable baseband source 340, and the linearization controller 330 is operatively coupled to the RF component 350 as described in further detail below.

Figure 4:
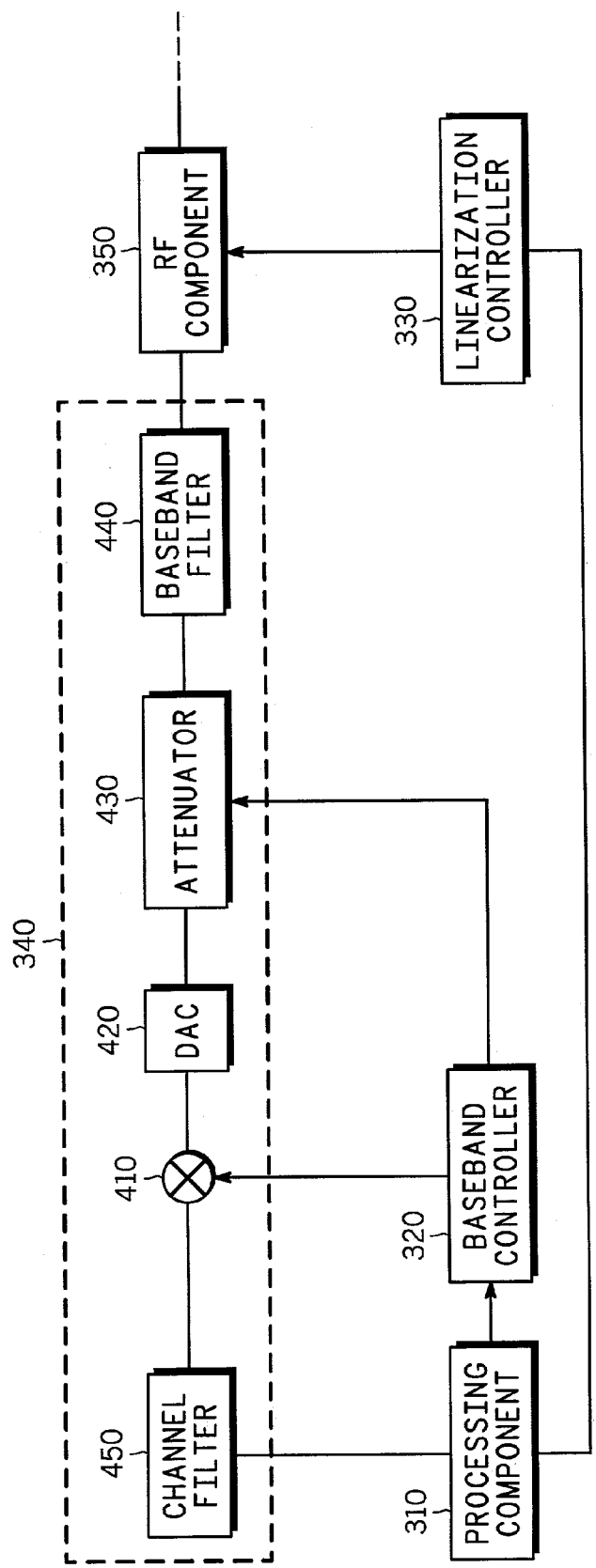
FIG. 4 is a block diagram representation of a baseband component associated with the transmitting unit.

As shown in FIG. 4, the variable baseband source 340 generally includes a digital multiplier 410, a digital-to-analog converter (DAC) 420, an attenuator 430 (e.g., a programmable baseband step attenuator), and a baseband filter 440. The digital multiplier 410 is operatively coupled to the DAC 420 which, in turn, is operatively coupled to the attenuator 430. The attenuator 430 is operatively coupled to the baseband filter 440 and the baseband controller 320. To provide the RF component 350 with the output of the variable baseband source 340, the baseband filter 440 is operatively coupled to the RF component 350 as described in further detail below. The variable baseband source 340 may also include a channel filter 450 (e.g., a finite impulse response FIR) filter), which is operatively coupled to the processing component 310. The channel filter 450 is operatively coupled to the digital multiplier 410 which, in turn, is operatively coupled to the baseband controller 320.

Figure 5:
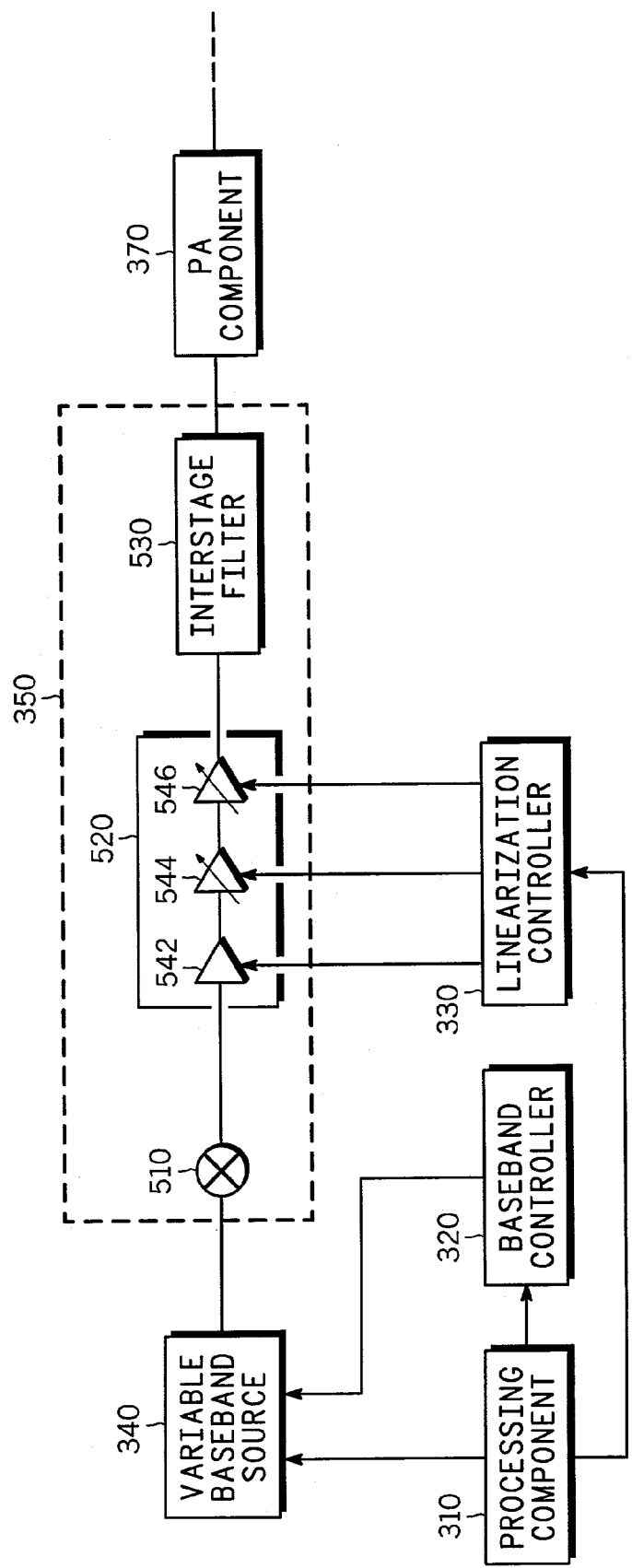
FIG. 5 is a block diagram representation of a radio frequency (RF) component associated with the transmitting unit.

As noted above, the variable baseband source 340 is operatively coupled to the RF component 350. Referring to FIG. 5, the RF component 350 generally includes an RF mixer 510, a variable gain amplifier component 520, and an interstage filter 530. In particular, the baseband filter 440 of the variable baseband source 340 is operatively coupled to the RF mixer 510 which, in turn, is operatively coupled to the variable gain amplifier component 520. The variable gain amplifier component 520 may include, but is not limited to, a post-mixer amplifier 542, and a plurality of voltage controlled amplifier (VCA) generally shown as a first VCA 544 and a second VCA 546. Accordingly, the linearization controller 330 is operatively coupled to the RF component 350 such that the linearization controller 330 is operable to adjust the variable gain amplifier component 520, i.e., the post-mixer amplifier 542, the first VCA 544, and the second VCA 546. Further, the variable gain amplifier component 520 is operatively coupled to the interstage filter 530.

Figure 6:
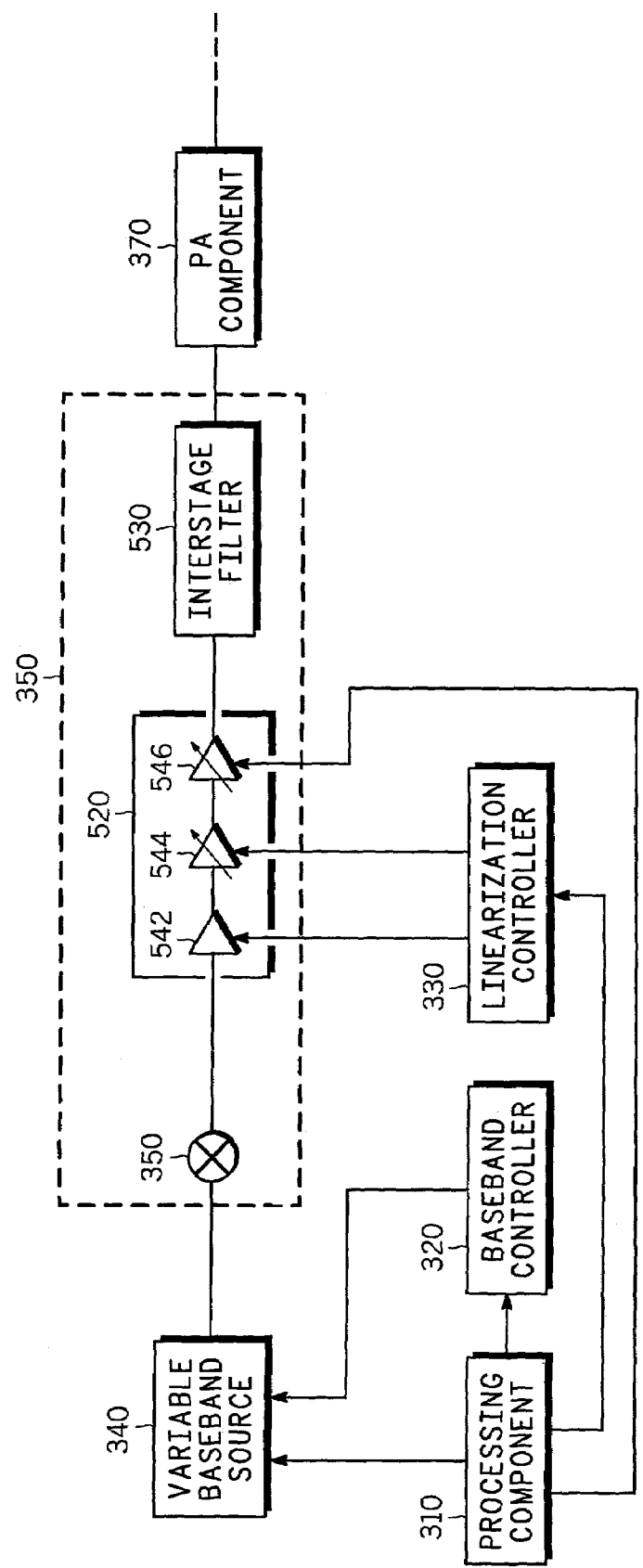
FIG. 6 is a block diagram representation of the transmitting unit adapted to operate in a manner as described herein.

Referring back to FIG. 3, the transmitting unit 220 further includes a power amplifier (PA) component 370 and a post-PA component 380. In particular, the PA component 370 is operatively coupled to the interstage filter 530 of the RF component 350 as shown in FIG. 6 to boost the signal power to the level to be transmitted as one of ordinary skill in the art will readily recognize. The post-PA component 380 is operatively coupled to the PA component 370 and the antenna 250. The post-PA component 380 may include, but is not limited to, a filter and a switch to prepare a radio frequency signal for transmission via the antenna 250 as one of ordinary skill in the art will readily recognize.

A basic flow for controlling transmission power associated with a transmitting unit that may be applied with the preferred embodiment of the present invention shown in FIGS. 2, 3, 4, and 5 may start the mobile station 162 (e.g., via the receiving unit 225) receiving power control information from a base station such base station 142 shown in FIG. 1. The power control information may specify the transmission power to be generated by the transmitting unit 220 of the mobile station 162 (i.e., RF output power). For example, the power control information may include an amount of power to increase or decrease the RF output power based on the quality of an RF signal received by the base station 142 from the mobile station 162. Based on that power control information, the processing component 310 generates a first control signal and a second control signal to satisfy the specified transmission power by the base station 142. For example, the first control signal may be a digital form of a control signal whereas the second control signal may be an analog form of the control signal. Accordingly, the processing component 310 provides the control signals to the baseband controller 320 and the linearization controller 330 to synchronously adjust the baseband and RF controls, respectively, associated with the transmitting unit 220. In particular, the processing component 310 provides the first control signal to the baseband controller 320 which, in turn, adjusts the variable baseband source 340 (i.e., to adjust the input power of the transmitting unit 220). Likewise, the processing component 310 provides the second control signal to the linearization controller 330 which, in turn, adjusts the RF component 350 (i.e., to adjust the bias level of the transmitting unit 220).

Typically, a radio frequency signal is based on a baseband signal. Thus, to generate the baseband signal, the processing component 310 may provide an input signal to the variable baseband source 340. The input signal may be a digital form of a signal including, but not limited to, voice, data, and multimedia. The channel filter 450, which may be a finite impulse response (FIR) filter that operates to limit bandwidth of the input signal to a single channel. As noted above, the processing component 310 provides the first control signal to the baseband controller 320 to adjust the variable baseband source 340. Based on the first control signal, for example, the baseband controller 320 may generate a first adjustment signal and a second adjustment signal to adjust the digital multiplier 410 (i.e., a digital gain/attenuation stage) and the attenuator 430 (i.e., an analog gain/attenuation stage), respectively, of the variable baseband source 340. In response to the first adjustment signal from the baseband controller 320, the digital multiplier 410 provides a scaling factor to adjust the amplitude of the output of the channel filter 450 (i.e., a fine adjustment to the input signal). Thus, the output of the channel filter 450 may be a signal that is proportional to the input signal from the processing component 310 (e.g., a multiple of the input signal). Then, the DAC 420 converts the output of the digital multiplier 410 from a digital form to an analog form. The attenuator 430 may adjust the output of the DAC 420 (i.e., a coarse adjustment to an analog form of the input signal) in response to the second adjustment signal from the baseband controller 320. Accordingly, the baseband filter 440 (e.g., a low-pass filter (LPF)) selectively sorts the output of the attenuator 430 to a desired frequency band (i.e., specific range of frequencies) to produce the baseband signal from the variable baseband source 340.

As mentioned above, the RF component 350 is operatively coupled to the variable baseband source 340. Thus, the variable baseband source 340 may provide the baseband signal to the RF component 350 to generate an RF signal. In particular, the RF mixer 510 modulates the baseband signal to a higher radio frequency for transmission over the air, i.e., a carrier. Accordingly, the variable gain amplifier component 520 receives the output of the RF mixer 510. The processing component 310 provides the second control signal to the linearization controller 330 to adjust the variable gain amplifier component 520. For example, the processing component 310 may provide the second control signal (e.g., the control signal in analog form) to the linearization controller 330 which, in turn, generates a plurality of adjustment signals to adjust the variable gain amplifier component 520. The post-mixer amplifier 542 and the first and second VCAs 544, 546 amplify the output of the RF mixer 510 based on the plurality of adjustment signals generated by the linearization controller 330. In particular, a first adjustment signal from the linearization controller 330 may adjust the bias level of the post-mixer amplifier 542 (e.g., adjust the voltage or current of the post-mixer amplifier 542). A second adjustment signal and a third adjustment signal may adjust the RF level of the RF signal via the first and second VCAs 544, 546, respectively (e.g., adjust the voltage of the first and second VCAs 544, 546 to control the amplitude of the output from the post-mixer amplifier 542). Accordingly, the inter-stage filter 530 selectively sorts the output of the variable gain amplifier component 520 to a desired range of frequencies (i.e., "clean-up" the edges) to produce the RF signal. Then, the PA component 370 may boost the signal power of the RF signal to the level to be transmitted while the post-PA component 380 may prepare the RF signal for transmission via an over-the-air channel.

In an alternate embodiment, the processing component 310 may also directly adjust the bias level of the RF component 350. In particular, the processing component 310 may be operatively coupled to the variable gain amplifier component 520. For example, the linearization component 330 may be operatively coupled to the post-mixer amplifier 542 and the first VCA 544 while the processing component 310 may be operatively coupled to the second VCA 546 as shown in FIG. 6.

Figure 7:
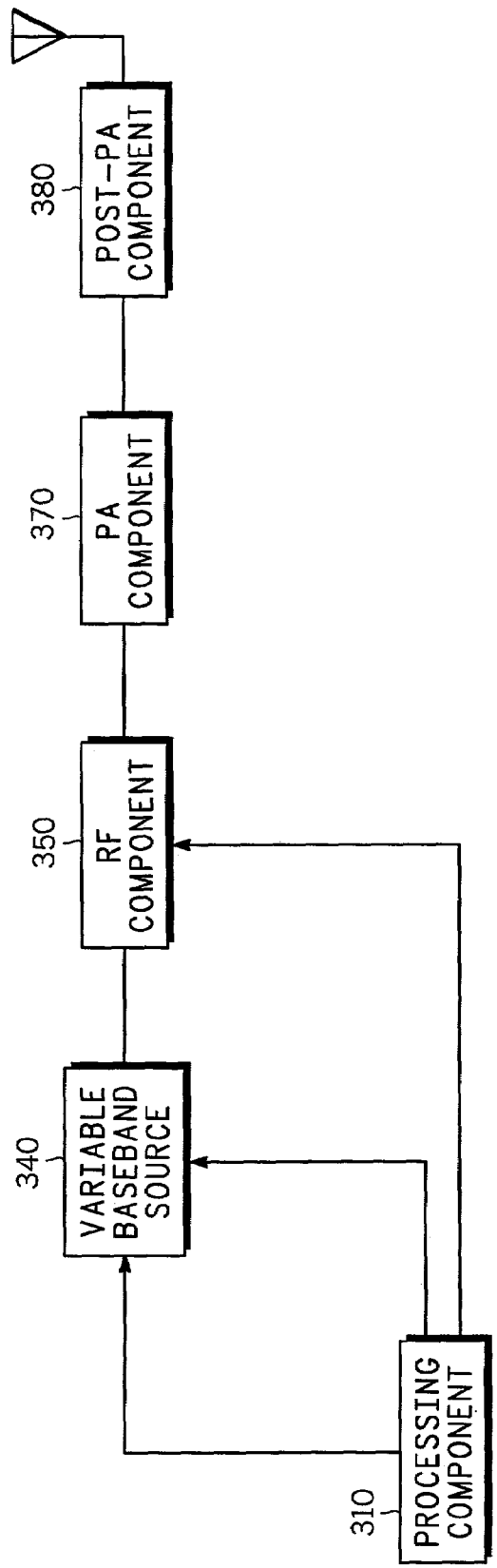
FIG. 7 is a block diagram representation of the transmitting unit adapted to operate in a manner as described herein.

In another alternate embodiment, the transmitting unit 220 may be entirely DSP-controlled by the processing component 310 (i.e., operate without the baseband controller 320 and the linearization controller 330). The processing component 310 may operate as both the baseband controller 320 and the linearization controller 330. Referring to FIG. 7, for example, the processing component 310 may operatively coupled to the variable baseband source 340 and the RF component 350. To adjust the input power of the transmitting unit 220, the processing component 310 may be operatively coupled to the digital multiplier 410 and the attenuator 430 of the variable baseband source 340. Further, the processing component 310 may be operatively coupled to the variable gain amplifier component 520 to adjust the bias level of the RF component 350. The processing component 310 may be operatively coupled to the post-mixer amplifier 542, and the first and second VCAs 544 and 546.

In yet another alternate embodiment, the transmitting unit 220 may include other modulators and intermediate frequency (IF) components as one of ordinary skill in the art will readily recognize to generate the radio frequency signal based on the baseband signal from the variable baseband source 340. For example, the transmitting unit 220 may include an IF component operatively coupled to the variable baseband source 340 and the RF component 350.

In addition to operating within a mobile station (e.g., a cellular telephone), the transmitting unit 220 may be integrated into other electronic devices such as, but not limited to, a cordless telephone, a personal digital assistant (PDA), and a laptop computer. Further, the transmitting unit 220 may be operable in accordance with a variety of wireless communication protocols such as, but not limited to, a code division multiple access (CDMA) based communication protocol, a time division multiple access (TDMA) based communication protocol, a global service for mobile communications (GSM) based communication protocol, a Bluetooth based communication protocol, and a wireless local area network (WLAN) communication protocol (e.g., an Institute of Electrical and Electronics Engineer (IEEE) 802.11 based communication protocol).

Figure 8:
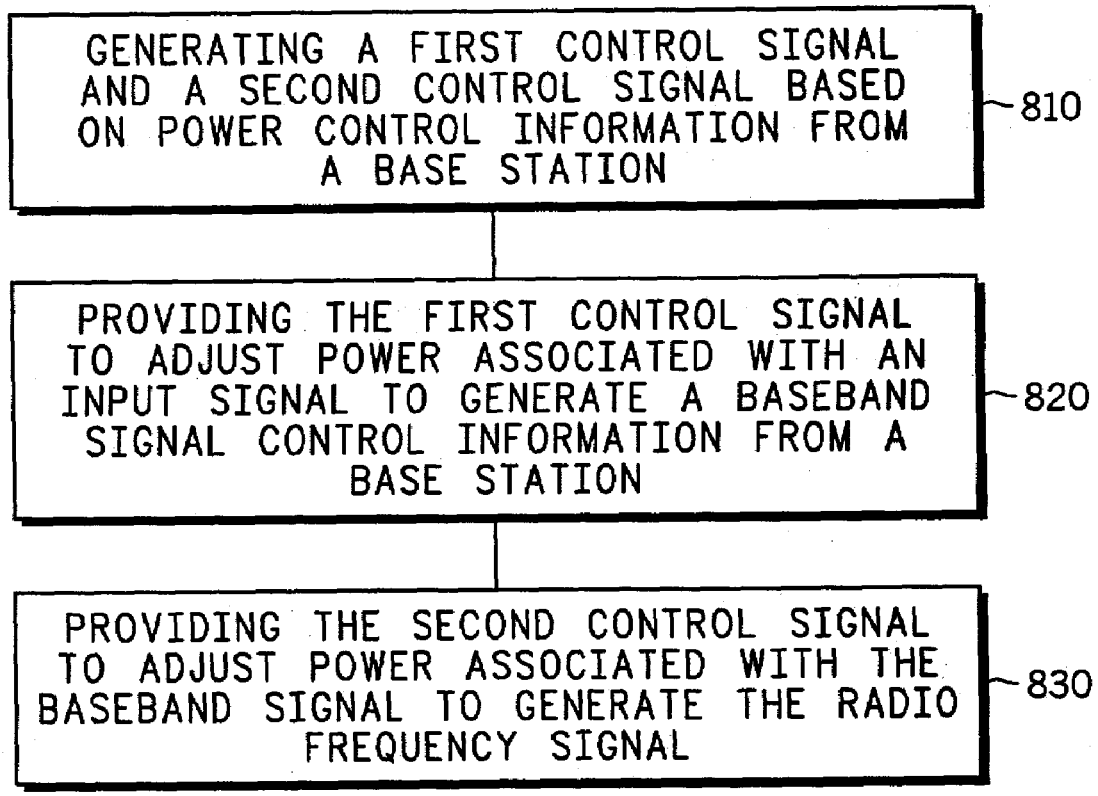
FIG. 8 is a flow diagram illustrating a method for controlling transmission power associated with a transmitting unit.

In accordance with the preferred embodiments of the present invention, and with references to FIG. 8, a method 800 for controlling transmission power associated with a transmitting unit of a mobile station is shown. Method 800 begins at step 810, wherein a mobile station generates a first control signal and a second control signal based on power control information from a base station providing communication service to the mobile station. The power control information provides information so that the mobile station may be operable in accordance with a wireless communication protocol (e.g., CDMA). Accordingly, the mobile station may adjust the input power and the bias level associated with the transmitting unit to meet the output power and linearity requirements of the wireless communication protocol. During an RF output power reduction as specified by the base station, for example, the mobile station may synchronously reduce the input power and the bias level associated with the transmitting unit. In particular, the processing component at step 820 provides the first control signal to adjust power associated with an input signal to generate a baseband signal (i.e., to reduce the input power of the transmitting unit). For example, the processing component may provide the first control signal to a baseband controller (e.g., one shown as 320 in FIG. 3) which, in turn, adjusts a variable baseband source associated with the transmitting unit (one shown as 340 in FIG. 3) to generate the baseband signal based on the input signal. Likewise at step 830, the processing component provides the second control signal to adjust the power associated with the baseband signal to generate the radio frequency signal (i.e., to reduce the bias level associated with the transmitting unit). That is, the processing component may provide the second signal to a linearization controller (one shown as 330 in FIG. 3) that is operable to adjust a radio frequency component associated with the transmitting unit (one shown 350 in FIG. 3) to generate the radio frequency signal. By reducing the input power and the bias level during an RF output power reduction, the mobile station may reduce the amount of supply current required to operate the transmitting unit. As a result of less power consumption by the transmitting unit, transmission efficiency of the mobile station may be improved (e.g., transmission time of a battery powering the mobile station may be extended).

Many changes and modifications to the embodiments described herein could be made. The scope of some changes is discussed above. The scope of others will become apparent from the appended claims.

What is claimed is:

1. In a wireless communication system, wherein a base station provides power control information to a mobile station, the mobile station comprising:
    a controller comprising a processor and a memory operatively coupled to the processor, and
    a transmitting unit operatively coupled to the controller, the transmitting unit comprising:
        a variable baseband source operable to generate a baseband signal based on an input signal;
        a radio frequency component operatively coupled to the variable baseband source, the radio frequency component being operable to generate a radio frequency signal based on the baseband signal;
        a processing component operatively coupled to the variable baseband source, the processing component being operable to generate a first control signal and a second control signal based on power control information from the base station to control transmission power of the radio frequency signal;
        a baseband controller operatively coupled to the processing component and the variable baseband source, the baseband controller being operable to adjust the variable baseband source based on the first control signal from the processing component; and
        a linearization controller operatively coupled to the processing element, the linearization controller being operable to adjust the radio frequency component based on the second control signal from the processing component.

2. The mobile station of claim 1, wherein the variable baseband source comprising:
    a digital multiplier operatively coupled to the processing component;
    a digital-to-analog converter operatively coupled to the digital multiplier;
    an attenuator operatively coupled to the digital-to-analog converter and the baseband controller; and
    a baseband filter operatively coupled to the attenuator and the radio frequency component.

3. The mobile station of claim 2, wherein the variable baseband source further comprising a channel filter operatively coupled to the processing component and the digital multiplier.

4. The mobile station of claim 2, wherein the variable baseband source further comprising a finite impulse response filter operatively coupled to the processing component and the digital multiplier.

5. The mobile station of claim 2, wherein the attenuator comprises a programmable baseband step attenuator.

6. The mobile station of claim 1, wherein the RF component comprising:
    an RF mixer operatively coupled to the variable baseband source;
    a variable gain amplifier component operatively coupled to the RF mixer and the linearization controller; and
    an interstage filter operatively coupled to variable gain amplifier component and the power amplifier.

7. The mobile station of claim 6, wherein the variable gain amplifier component comprises one of a post-mixer amplifier and a voltage controlled amplifier (VCA) operatively coupled to the linearization controller.

8. The mobile station of claim 7, wherein the linearization controller is operable to adjust bias level of the post-mixer amplifier.

9. The mobile station of claim 6, wherein the variable gain amplifier component comprises a post-mixer amplifier, a first voltage controlled amplifier (VCA), and a second voltage controlled amplifier (VCA), the post-mixer amplifier and the first voltage controlled amplifier are operatively coupled to the linearization controller, and the second voltage controlled amplifier (VCA) is operatively coupled to the processing component.

10. The mobile station of claim 1 further comprising a power amplifier operatively coupled to the radio frequency amplifier component.

11. The mobile station of claim 1 wherein the baseband controller and the linearization controller are operable to substantially synchronously adjust the variable baseband source and the radio frequency component based on the first and second control signals, respectively.

12. The mobile station of claim 1, wherein the mobile station operates in accordance with one of a code division multiple access (CDMA) based communication protocol, a time division multiple access (TDMA) based communication protocol, a global service for mobile communications (GSM) based communication protocol, a Bluetooth based communication protocol, and a wireless local area network (WLAN) communication protocol.

13. In a wireless device, a transmitting unit comprising:
    a variable baseband source operable to generate a baseband signal based on an input signal;
    a radio frequency component operatively coupled to the variable baseband source, the radio frequency component operable to generate a radio frequency signal based on the baseband signal; and
    a processing component operatively coupled to the variable baseband source and the radio frequency component,
    the processing component being operable to adjust power associated with the input signal and power associated with the baseband signal to generate the radio frequency signal.

14. The transmitting unit of claim 13, wherein the processing component is operable to generate a first control signal and a second control signal, and wherein the transmitting unit further comprising:
    a baseband controller operatively coupled to the processing component and the variable baseband source, the baseband controller being operable to adjust the variable baseband source based on the first control signal; and
    a linearization controller operatively coupled to the processing component and the radio frequency component, the linearization controller being operable to adjust the radio frequency component based on the second control signal.

15. The transmitting unit of claim 13, wherein the transmitting unit operates in accordance with one of a code division multiple access (CDMA) based communication;

protocol, a time division multiple access (TDMA) based communication protocol, a global service for mobile communications (GSM) based communication protocol, a Bluetooth based communication protocol, and a wireless local area network (WLAN) communication protocol.

16. The transmitting unit of claim 13, wherein the wireless device is one of a cellular telephone, a cordless telephone, a personal digital assistant (PDA), and a laptop computer.

* * * * *